US008463452B2

(12) United States Patent
Masters et al.

(10) Patent No.: US 8,463,452 B2
(45) Date of Patent: Jun. 11, 2013

(54) APPARATUS USING TIME-BASED ELECTRICAL CHARACTERISTICS TO IDENTIFY AN ELECTRICAL APPLIANCE

(75) Inventors: Gilbert J. Masters, Belmont, CA (US); Marcos B. Pernia, San Mateo, CA (US)

(73) Assignee: Enmetric Systems, Inc., Belmont, CA (US)

( * ) Notice: Subject to any disclaimer, the term of this patent is extended or adjusted under 35 U.S.C. 154(b) by 0 days.

(21) Appl. No.: 12/512,013

(22) Filed: Jul. 29, 2009

(65) Prior Publication Data
US 2010/0030393 A1 Feb. 4, 2010

Related U.S. Application Data

(60) Provisional application No. 61/084,539, filed on Jul. 29, 2008.

(51) Int. Cl.
*G06F 19/00* (2006.01)

(52) U.S. Cl.
USPC .............................. 700/295; 702/57; 340/657

(58) Field of Classification Search
USPC ...... 700/295, 292; 702/57, 60–62; 324/76.12; 340/657; 713/340
See application file for complete search history.

(56) References Cited

U.S. PATENT DOCUMENTS

| | | | |
|---|---|---|---|
| 4,686,380 A | 8/1987 | Angott | |
| 5,315,531 A | 5/1994 | Oravetz et al. | |
| 5,352,957 A | 10/1994 | Werner | |
| 5,483,153 A | 1/1996 | Leeb et al. | |
| 5,699,051 A | 12/1997 | Billig et al. | |
| 5,717,325 A * | 2/1998 | Leeb et al. | 324/76.12 |
| 6,226,600 B1 | 5/2001 | Rodenberg, III et al. | |
| 6,330,516 B1 | 12/2001 | Kammeter | |
| 6,874,691 B1 | 4/2005 | Hildebrand et al. | |
| 6,993,417 B2 | 1/2006 | Osann, Jr. | |
| 7,010,363 B2 * | 3/2006 | Donnelly et al. | 700/19 |
| 7,043,380 B2 | 5/2006 | Rodenberg, III et al. | |
| 7,058,524 B2 | 6/2006 | Hayes et al. | |

(Continued)

OTHER PUBLICATIONS

Laughman, C.; Kwangduk Lee; Cox, R.; Shaw, S.; Leeb, S.; Norford, L.; Armstrong, P.; , "Power signature analysis," Power and Energy Magazine, IEEE , vol. 1, No. 2, pp. 56-63, Mar.-Apr. 2003.*

(Continued)

*Primary Examiner* — Dave Robertson
(74) *Attorney, Agent, or Firm* — Shermia D. Pernia

(57) ABSTRACT

Disclosed is an apparatus for analyzing time-base electrical load characteristics of an electrical appliance on a micro-grid, to identify the type of the appliance and to monitor its utility usage and operational condition. The apparatus has a signal conditioner; a signature engine; an ID-engine; and a database. A system manager provides control and external communications. The signal conditioner receives load character input signals, and generates a conditioned signal containing the load's electrical characteristics and sends the signal to the signature engine. The signature engine generates a signature signal based on the conditioned signal. The ID-engine takes the signature signal, analyzes it in view of signature ID criteria stored in the database to identify the type of the attached electrical appliance, and stores the identity in the database. The database can be utilized to identify the type of other appliances and to monitor their utility usage and operational condition.

8 Claims, 1 Drawing Sheet

U.S. PATENT DOCUMENTS

| | | | |
|---|---|---|---|
| 7,099,785 B2* | 8/2006 | Lee et al. | 702/57 |
| 7,133,845 B1 | 11/2006 | Ginter et al. | |
| 7,171,161 B2* | 1/2007 | Miller | 455/67.11 |
| 7,276,915 B1 | 10/2007 | Euler et al. | |
| 7,349,766 B2 | 3/2008 | Rodgers | |
| 7,657,763 B2* | 2/2010 | Nelson et al. | 713/300 |
| 7,693,670 B2* | 4/2010 | Durling et al. | 702/62 |
| 7,885,917 B2* | 2/2011 | Kuhns et al. | 706/48 |
| 7,904,260 B2* | 3/2011 | Burlak et al. | 702/57 |
| 8,094,034 B2* | 1/2012 | Patel et al. | 340/657 |
| 2002/0104031 A1 | 8/2002 | Tomlinson et al. | |
| 2004/0254654 A1 | 12/2004 | Donnelly et al. | |
| 2007/0051544 A1 | 3/2007 | Fernandez | |
| 2007/0101173 A1 | 5/2007 | Fung | |
| 2007/0213956 A1 | 9/2007 | Nasle et al. | |
| 2007/0229376 A1 | 10/2007 | Desclos et al. | |
| 2010/0145542 A1* | 6/2010 | Chapel et al. | 700/295 |

OTHER PUBLICATIONS

W. Lee, G. Fung, H. Lam, F. Chan, and M. Lucente. Exploration on load signatures. International Conference on Electrical Engineering (ICEE), 2004.*

Lam, H.Y.; Fung, G.S.K.; Lee, W.K.; , "A Novel Method to Construct Taxonomy Electrical Appliances Based on Load Signaturesof," Consumer Electronics, IEEE Transactions on , vol. 53, No. 2, pp. 653-660, May 2007.*

K. H. Ting, M. Lucente, G. S. K. Fung, W. K. Lee, and S. Y. R. Hui, "A Taxonomy of Load Signatures for Single-Phase Electric Appliances," in IEEE PESC (Power Electronics Specialist Conference), Jun. 2005, pp. 12-18.*

Ting et al.; "A Taxonomy of Load Signatures for Single-Phase Electric Appliances;" http://web.archive.org/web/20050105121725/http://lucent.us/pubs/2005-IEEE-PESEC-preprint.pdf; Jan. 2005.

* cited by examiner

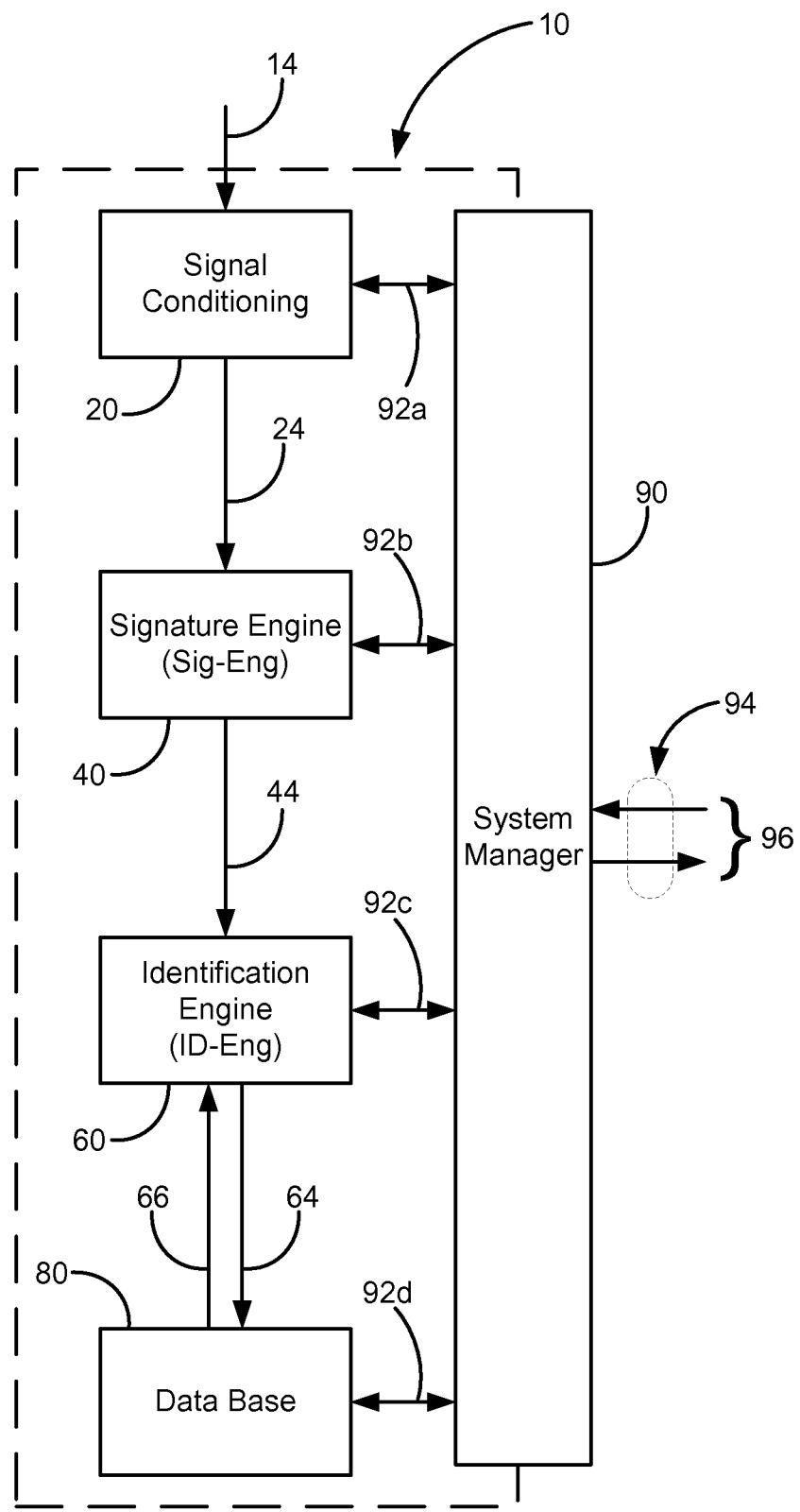

APPARATUS USING TIME-BASED ELECTRICAL CHARACTERISTICS TO IDENTIFY AN ELECTRICAL APPLIANCE

The present application claims the benefit of prior filed U.S. Provisional Patent Application Ser. No. 61/084,539 filed 29 Jul. 2008; to which the present application is a regular US national application, and which prior application is incorporated herein by reference.

FIELD OF THE INVENTION

The present invention is in the field of measuring, testing or sensing of the electric properties per se of an electrical appliance load. Specifically, the present invention relates to a system for analyzing the electrical properties of an electrical appliance load to identify the electrical appliance by the time-based electrical characteristics of the load, and for recording the result of the analysis.

BACKGROUND OF THE INVENTION

The local electrical grid (micro-grid) of a modern residence, a commercial location or other premises hosts a variety of electrical appliances representing diverse electrical loads. The individual load devices represented by these electrical loads are transparent—not individually identifiable—to the electrical power provider, or to any party/system that could otherwise benefit from knowledge of the identity, state and condition of the individual appliance drawing from the electrical power source. It should be noted that an individual load device can be any type of appliance on the local micro-grid, including: typical household appliances (e.g., refrigerators, washers, televisions, etc.), heating/air-conditioning units, air-handling equipment, power benches, machine tools, lighting appliances, electronics, industrial equipment, turbines, generators, etc.

If the identification of such appliance loads on the micro-grid can be made with confidence, a new level of control, management and maintenance can be made available to a broad range of beneficiaries: e.g., utility providers seeking to identify loads for remote load analysis & control; marketing organizations in need of highly reliable power usage data, OEM's looking to identify customer bases, or residential and commercial premises power consumers looking to manage their electrical energy usage.

The field has been motivated to move at least somewhat in this direction, in that means for monitoring the overall power consumption of a premises are known in the art. For example, Hart. et al. (U.S. Pat. No. 4,858,141) describe an apparatus that is attached to the power line outside a residence, and monitors the overall power consumption of the loads in the residence. Further, Hart reports the ability detect the time specific contribution of individual, unidentified appliance loads to the overall power consumption of the residence. However, the Hart apparatus only monitors the power supply line into the residence, does not and cannot receive or process an input from or identify an individual appliance load as a specific appliance (i.e., refrigerator #1 from refrigerator #2). Also, if the duty cycle of refrigerators #1 & #2 overlap, the Hart apparatus cannot precisely distinguish which of the two came on first or went off last. Although, such apparatuses or systems may be useful for their intended purpose, if they only monitor the overall power consumption of a micro-grid (or a branch of the grid) the identification and characterization of the specific, individual appliance associated with a detected load cannot be made with confidence.

Further, it would be extremely beneficial to be able to use the identity of individual appliances to access a specific appliance to monitor and control its power consumption. The ability to identify an individual appliance, to characterize it power usage profile, even without the ability to control its operation, allows resource planning and budgeting, maintenance scheduling, determination of the operational condition of such loads, and optimizing their draw of power the electrical source/provider.

SUMMARY OF THE INVENTION

The present invention is an apparatus and method that enables a user to monitor and manage an individual appliance on a micro-grid by identifying it via the time-based characteristics of its electrical load. This is accomplished by processing and analyzing time-based data that represent the characteristics of the electrical load of an individual specific appliance on a micro-grid. The electrical appliance load characteristics represented by the data include: electrical power, voltage, current, power factor, line frequency, noise, etc. The individual specific appliances can be any type of device powered by the micro-grid, including: typical household appliances (e.g., refrigerator, television, lamp, washer, etc.), heating/air-conditioning units, air-handling equipment, power benches, machine tools, lighting appliances, electronics, industrial equipment, turbines, generators, etc.

Generally, the present apparatus for analyzing a load's electrical characteristics consists of: a signal conditioner; a signature engine; an ID-engine; and a database. A system manager provides overall control of the components of the apparatus, and provides for external communications. The signal conditioner receives electrical load characteristics data from one or more load appliances on the micro-grid (or from other appliance sources of similar electrical load characteristics data). The signal conditioner then conditions the received data characteristics signal for use by other components of the apparatus with which it communicates. In particular, the signal conditioner communicates a conditioned data characteristics signal to a signature engine. The signature engine is adapted to take the conditioned signal and generate a signature signal based on the original received data characteristics of the conditioned signal. The signature signal and any indicia of a source appliance are communicated to an ID-engine component.

The ID-engine is adapted to receive the signature signal, to analyze the signature signal in view of a set of signature ID criteria, and to determine the type of appliance that was the source of the original electrical load characteristics data. This determination and any indicia of the source appliance are stored in a database. A system manager component provides overall control of the apparatus, and communication interfaces (I/O ports) for sending and receiving external signals.

In the signature engine, the conditioned data characteristics signal representing the electrical load characteristics of a specific individual appliance is processed into specific component parts and further used to generate an identifying "signature" unique to the source electrical load or appliance. This signature is then analyzed to determine a multitude of unique or identifying characteristics of the source electrical load, such as: the category of the appliance that generated the load; the specific type of the appliance, its operational state, and its electromechanical condition; etc. A category is defined as, for example, appliances that are: inductive appliances, resistive appliance, capacitive appliances, etc.

Further, it is intended that this determination be made with a high level of confidence. As the extent of a multitude of individual appliance types are identified and categorized in the database by their signatures, analysis of their associated signatures can be used to determine the category, specific type, state, and condition of a newly generated load appliance signature. This is accomplished by using the database to compare the new signature against known appliance type signatures, both algorithmically and heuristically, and justifying signature against a matrix of known appliance type electrical load characteristics or by identification by direct user input.

BRIEF DESCRIPTION OF THE DRAWINGS

FIG. 1 is a high level block diagram describing major functional components of the present apparatus and system for identifying electrical load appliances through the processing and analysis of the time-based electrical characteristics of that appliance.

DETAILED DESCRIPTION OF THE INVENTION

The present invention is a system having an apparatus and method for use with a micro-power grid to identify a specific appliance on the grid, and its type, through the analysis of the time-based electrical load characteristics of that appliance. A preferred embodiment of the present invention will be described with reference to the accompanying drawing to better illustrate the present apparatus and method. Referring now to the drawing, the details of preferred embodiments of the present invention are graphically and schematically illustrated. Like elements in the drawing are represented by like numbers, and any variations of the same element are represented by like numbers with different lower case letter suffixes.

The present invention includes an apparatus 10 for analyzing time-based electrical load characteristics of an electrical appliance to identify a type of the electrical appliance and its electrical condition. The primary components of the apparatus 10 are: a signal conditioner 20; a signature engine 40; an ID-engine 60; a database 80; and a system manager 90. Referring to FIG. 1, a high level block diagram indicates major functional components of the present apparatus.

The input to the signal conditioner 20 contains electrical load characteristics data. The electrical characteristics that the electrical load data signal 14 can communicate include specific electrical values, such as Wattage, Amperage, Voltage, power factor, line frequency, and electrical noise, etc, of the attached appliance. The signal conditioner 20 receives load character input signals 14. Additionally, a load character input signal 14 can include electrical load characteristic data of more than one load device/appliance (not shown). The signal conditioning component pre-processes the received electrical load characteristics signal data 14 for further processing and analysis. The signal conditioner 20 is adapted to generate a conditioned signal 24 from the received data characteristics signal 14, the conditioned signal 24 for use by other components of the apparatus with which it communicates. The signal conditioner 20 performs certain operations on the received signal 14, such as: filtering, normalizing and otherwise processing the content of the received data characteristics signal 14 as appropriate for delivery to one or more of the other components of the apparatus 10. In particular, signal conditioner 20 filters the data signal 14 to select the specific data of interest. The data of interest can further be time-specific data. For example, time-specific electrical characteristics reported during a transitional state (e.g., off-to-on) of the load appliance may be selected. Other time-specific data values may be selected from when the load appliance is in a steady state. At the instruction of the system manager 90, the signal conditioner 20 can direct the filtered data to any of the apparatus' component, or to simply discard it. Primarily, the signal conditioner 20 will communicate a conditioned signal 24 containing filtered data on to the signature engine 40.

The signature engine 40 receives the conditioned signal 24 and generates a signature signal 44 based on the data content of the conditioned signal 24. The signature engine 40 component of the apparatus 10 processes the conditioned signal 24 to produce a unique "signature" to represent the load appliance.

A process for analyzing electrical load characteristics of a load appliance to generate an appliance signature is new in the art. See for example Ting, K. H. et al., A Taxonomy of Load Signatures for Single-Phase Appliances, IEEE: Power Electronics Specialist Conference, June 2005, Brazil; incorporated herein by reference. The signature can be represented as an encoded data string, which includes the specific electrical characteristics of the load appliance. The signature engine 40 analyzes the conditioned signal 24 for the specific time-based electrical characteristics data of the electrical load appliance and any other pertinent data contained in the signal 24. The signature engine 40 assigns values to the data to create a "signature" unique to the source appliance. The signature may be presented as a numerical value, mathematically encoded to represent the type and electrical characteristics of the load appliance. The signature engine 40 communicates a signature signal 44 containing signature data on to the identification engine 40.

The identification engine ("ID-engine") 60 is adapted to receive the signature signal 44, and to analyze the signature signal 44 in view of a set of signature ID criteria 66 to identify the type and/or the category of the attached electrical appliance. By analyzing specific point-in-time electrical power characteristics and any other indicia of the load appliance contained in the signature signal 44, values representative of that type of appliance can be derived.

The ID-engine 60 processes the signature signal 44 of the load appliance to determine its identifying characteristics, such as: the device's category, the specific type of the appliance (and possibly, its make and model). In one implementation, by comparing the signature of a specific electrical load appliance to known appliance values, the ID-engine 60 can identify the type (i.e., washer, refrigerator, AC unit, etc.) of the load appliance. The ID-engine 60 can also determine the identity of the load appliance probabilistically by analyzing the appliance signature signal 44. Additionally, the ID-engine 60 can also determine, or further resolve, the type and specific identity of an individual load appliance through user interaction. The ID-engine 60 communicates with the database 80 and can store the identity therein.

The ID-engine 60 determines the device type of the load appliance based on the signature 44 of the appliance's electrical load characteristics 14. For example, the ID-engine 60 may determine that the load appliance is an incandescent light bulb. The ID-engine 60 can employ a number of methods to determine the type of the load appliance. For example, the ID-engine 60 may compare the reported signature data 44 to a list of known signature-IDs that exists in the database 80. Also, the ID-engine 60 can make calls to remote databases (not shown) for additional signature and ID comparisons. The ID-engine 60 can also employ (e.g., heuristic) analysis of the signature data 44 to specifically or probabilistically identify the load appliance. For example, the ID-engine 60 can determine that the load device is inductive in nature, thus eliminating resistive-(and other) type load appliances from the possible appliance types, and in a following step the ID-engine 60 may determine that the load appliance has a specific duty-cycle to further eliminate appliances of those types.

Lastly, the ID-engine 60 can make calls via the I/O interfaces 94, prompting user input to help determine the type of the appliance. Once the ID-engine 60 has made the appliance type determination, a signature-ID pairing is created and communicated to the database component 80 for storage. The apparatus 10 can then use the stored signature-ID pairing as reference data for subsequent appliance type determinations.

By following a similar process, the apparatus 10 can also diagnose the condition (i.e., "health) of the load appliance. For example, once identification of the type of the appliance has been made, changes in the time-specific electrical load characteristics signal 14 of the appliance can be used to determine whether the appliance is operating abnormally. The apparatus can then direct the signal conditioner to more selectively filter the load characteristics signal data 14 to collect more diagnostic specific information.

The database 80 is a memory component for storage and retrieval of data and instructions generally. The database 80 provides storage and retrieval of data for use and manipulation by the different components of the apparatus 10 and located discreetly or distributed in the apparatus 10. Additionally, the database or a portion thereof can be remotely located separately from the apparatus 10, providing for distributed implementation of the present invention across a plurality of different types of data storage means and different locations.

The system manager 90 is adapted to provide overall control of the apparatus 10 and to communicate with the other components of the apparatus 10 via internal comm links 92a-92d. The system manager 90 has one or more I/O communication interfaces 94 for sending and receiving external signals 96. The I/O interfaces 94 may be accomplished using any of a number of I/O modalities known to and selectable by one of ordinary skill in the art. The interfaces 94 can communicate with user input devices, display devices, storage devices or local and wide area networks (such as phone, radio and global computer networks).

While the above description contains many specifics, these should not be construed as limitations on the scope of the invention, but rather as exemplifications of one or another preferred embodiment thereof. Many other variations are possible, which would be obvious to one skilled in the art. Accordingly, the scope of the invention should be determined by the scope of the appended claims and their equivalents, and not just by the embodiments.

What is claimed is:

1. An apparatus (10) for analyzing time-based electrical load characteristics of an electrical appliance on a premises micro-power grid to identify an individual specific electrical appliance, the apparatus consisting of:
   a signal conditioner (20) receiving electrical load character signals (14) of the electrical appliance, the signal conditioner (20) adapted to generate a conditioned signal (24) adapted for use by other components of the apparatus;
   a signature engine (40) adapted to receive the conditioned signal (24) and to generate a signature signal (44) based on the conditioned signal (24), the signature signal including signature data and an assigned value in the signature signal to make the signature signal unique to the electrical appliance;
   an ID-engine (60) adapted to receive the signature signal (44), to analyze the signature data in the signature signal (44) in view of a set of signature ID criteria (66) to identify the individual specific electrical appliance, and to store the identity in a database (80), and further adapted to derive the identity of the appliance through a user interaction and/or calls to a remote database for storage and additional signature ID data; and
   a system manager (90) adapted to provide overall control of the apparatus (10), and having I/O interfaces (94) for sending and receiving signals (94, 14).

2. The apparatus (10) of claim 1 for analyzing time-based electrical load characteristics of a specific electrical appliance, wherein the signal conditioner (20) receives and conditions both steady state and transitional state electrical load characteristic signals (14) from the specific appliance.

3. The apparatus (10) of claim 1, wherein the signal conditioner (20) receives and conditions a steady state time-based electrical load characteristics signal of the appliance, and the apparatus identifies (10) the specific electrical appliance.

4. The apparatus (10) of claim 1, wherein the signal conditioner (20) receives and conditions a transitional state time-based electrical load characteristics signal of the appliance, and the apparatus identifies (10) the specific electrical appliance.

5. The apparatus (10) of claim 1, wherein the conditioned signal (24) output from the signal conditioner (20) is generated from received a steady state and/or transitional state time-based electrical load data characteristic signal (14).

6. The apparatus (10) of claim 1, wherein the conditioned signal (24) output from the signal conditioner (20) is generated in response to an on/off transitional state signal of the appliance.

7. An apparatus (10) for analyzing a time-based electrical load characteristic signal from an electrical appliance load on a micro-power grid to identify an electrical appliance of the load as an individual specific electrical appliance, the apparatus comprising:
   a signal conditioner (20) receiving the electrical load characteristic signal (14) of the electrical appliance, the signal conditioner (20) adapted to pre-process the received electrical load signal to generate a conditioned signal (24) for use by other components of the apparatus (10);
   a signature engine (40) adapted to receive the conditioned signal (24) and generate a signature signal (44) based on the conditioned signal (24), the signature signal including an indicia to make the signature signal unique to the electrical appliance;
   an ID-engine (60) adapted to receive the signature signal (44), to analyze the signature signal (44) in view of a set of signature ID criteria (66) to identify the individual specific electrical appliance, and to store the identity and the indicia of the individual specific electrical appliance in a database (80), and to compare the time-based electrical load characteristic signal to the database to determine whether the individual specific appliance is operating abnormally and requires the signal conditioner (20) to more selectively filter the load characteristics signal data (14) to collect diagnostic data; and
   a system manager (90) adapted to provide overall control of the apparatus (10), and having I/O interfaces (94) for sending and receiving signals (94, 14).

8. The apparatus (10) of claim 1 for analyzing an electrical load characteristic signal from an electrical appliance, wherein the indicia of the individual specific electrical appliance stored by the ID-engine (60) in the database (80) includes an identification of a specific apparatus (10) causing the indicia to be stored in the database (80).

* * * * *